Figure 1:
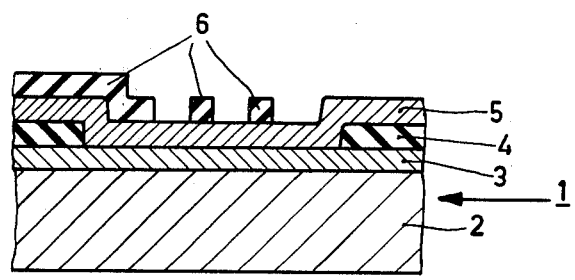

United States Patent [19]

Tijburg et al.

[11] 4,131,525

[45] Dec. 26, 1978

[54] METHOD OF MANUFACTURING A BODY HAVING A GOLD PATTERN AND BODY MANUFACTURED ACCORDING TO THE METHOD

[75] Inventors: Rudolf P. Tijburg; Teunis van Dongen, both of Eindhoven, Netherlands

[73] Assignee: U.S. Philips Corporation, New York, N.Y.

[21] Appl. No.: 828,480

[22] Filed: Aug. 29, 1977

[30] Foreign Application Priority Data

Mar. 9, 1976 [NL] Netherlands ........................ 7609816

[51] Int. Cl.² ............................................... C25F 3/14
[52] U.S. Cl. ................................................ 204/129.65
[58] Field of Search ...................................... 204/129.65

[56] References Cited

U.S. PATENT DOCUMENTS

| | | | |
|---|---|---|---|
| 3,267,013 | 8/1966 | Mathias et al. | 204/129.65 |
| 3,325,384 | 6/1967 | Frantzen | 204/129.65 |
| 3,418,226 | 12/1968 | Marinace | 204/129.65 |

Primary Examiner—T. M. Tufariello
Attorney, Agent, or Firm—Thomas A. Briody; Steven R. Biren

[57] ABSTRACT

The invention relates to a method of manufacturing a body having a gold pattern in which an etchant-resistant and electrically insulating masking layer is provided locally on the surface of a gold layer present on the body and parts of the surface of the gold layer not covered by the masking layer are subjected to a chemical etching treatment in an etching bath in which the gold pattern is formed. According to the invention, the gold layer during the chemical etching treatment is given a potential with respect to an electrode in the etching bath and this potential is adjusted to a value such that the etch rate is maintained at a rate no higher than the rate of the chemical etching treatment.

3 Claims, 2 Drawing Figures

METHOD OF MANUFACTURING A BODY HAVING A GOLD PATTERN AND BODY MANUFACTURED ACCORDING TO THE METHOD

The invention relates to a method of manufacturing a body having a gold pattern in which an etchant-resistant and electrically insulating masking layer is provided locally on the surface of a gold layer present on the body and parts of the surface of the gold layer not covered by the masking layer are subjected to a treatment in an etching bath in which the gold pattern is formed. The invention also relates to a body having a gold pattern manufactured by means of the method.

Methods of the kind mentioned in the preamble are generally used, for example, to obtain conductor tracks for semiconductor devices, for example, high-frequency transistors and light-emissive diodes. When in this specification there is reference to a gold pattern or a gold layer, this is to be understood to mean a pattern and a layer, respectively, which, in addition to gold, may also comprise other elements. The gold pattern and the gold layer may be present on a conductive or an insulating base.

A photolacquer is often used as an etchant-resistant and electrically insulating masking layer. It is often found that upon etching in an etching bath, underetching occurs and the etching rate in a zone adjoining the layer of photolacquer is considerably larger than in uncovered places which are further from the edge of the layer or photolacquer. It is also often found that the etching rate at the edge of a semiconductor disc is much larger than in the center of the disc.

The drawback of this is that the width of conductor tracks to be obtained is often poorly defined and the usual etching method cannot be used at all, in particular to obtain narrow, thin conductor tracks.

One of the objects of the invention is to avoid the described drawback at least considerably and the invention is based on the recognition of the fact that the described drawbacks may be caused by potential differences occurring at and near the edge of the masking layer.

Therefore, according to the invention, the method is characterized in that during the etching treatment the gold layer is given a potential with respect to an electrode in the etching bath, the etching rate remaining at most equal to the chemical etching rate obtained without applied voltage.

It is achieved by means of the method according to the invention that parts of the gold layer not covered by the masking layer are etched uniformly, that underetching is small and usually even negligible and that the etching rate is not dependent on the site on a surface of a semiconductor disc.

Gold tracks of, for example, 0.25 μm thick and 10 μm wide or 3 μm thick and 3 μm wide can easily be obtained by means of the method according to the invention.

The method according to the invention is preferably used in cases in which a gold pattern is to be obtained which is situated at least partly on an electrically insulating substratum.

If an applied gold layer separates into separate parts during etching, the desired effect, namely uniform etching, is nevertheless achieved to a considerable extent.

Figure 2:
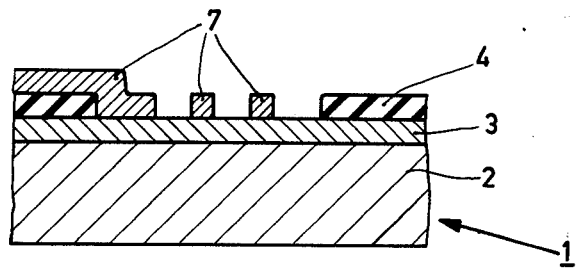

The invention will now be described in greater detail with reference to the ensuing examples and the accompanying drawing. dr In the drawing FIGS. 1 and 2 are diagrammatic sectional views of a part of a body in successive stages of manufacture by means of a method according to the invention.

In a method of manufacturing a body 1 comprising an n-type gallium phosphide substrate 2 and a p-type epitaxial gallium phosphide layer 3 and having a gold pattern 7 (see FIG. 2) an etchant-resistant and electrically insulating masking layer 6 is provided locally on the surface of a gold layer 5 present on the body 1 (FIG. 1).

As is shown in FIG. 1, the gold layer 5 is in contact with the epitaxial layer 3 in the aperture of a silicon nitride layer 4.

The gold layer 5 consists of 97% by weight of gold, 2% by weight of beryllium and 1% by weight of manganese and is provided in a usual manner by vapor deposition.

The masking layer 6 consists of a positive photolacquer layer in the form of the pattern desired in the gold layer.

In an electroluminescent diode the required pattern often has a large number of tracks of small width, namely 10 μm, in order on the one hand to obtain an area which is as large as possible for contacting and on the other hand to impede the emanation of light as little as possible.

Parts of the surface of the gold layer 5 not covered by the masking layer 6 are then subjected to a treatment in an etching bath in which the gold pattern 7 is formed.

According to the invention, the gold layer 5 during the etching treatment is given a potential with respect to an electrode in the etching bath. The etching rate does not increase as compared with the chemical etching rate obtained without applied voltage.

The potential which is to be given to the gold with respect to the etching bath depends on the composition of the etching bath.

The potential of a gold wire which is covered with the commercially available positive photolacquer Shipley AZ-1350H with respect to a calomel electrode in a usual cyanide bath is −140 mV. The potential of an uncovered gold wire under otherwise identical conditions is −675 mV.

Uniform etching without underetching phenomena is now obtained when in a cyanide etching bath the gold to be etched on a semiconductor disc of approximately 4cm diameter is given a potential of −1000 mV with respect to a platinum electrode. The potential with respect to the calomel electrode then is −690 mV.

In a usual KJ-J$_2$ etching bath the above-described gold wire covered with photolacquer gives a potential of +30 mV with respect to a calomel electrode and the uncovered gold wire a potential of +330 mV.

In order to obtain the advantages described of the method according to the invention the gold to be etched in a KJ-J$_2$ etching bath is given a potential of +1000 mV with respect to a platinum electrode. The potential with respect to the calomel electrode then is +385 mV.

It will be obvious that the invention is not restricted to the examples described.

In addition to photolacquer, a wax or an inorganic material, for example silicon dioxide, may also be used for the etchant-resistant and electrically insulating masking layer.

Other III-V compounds such as gallium arsenide phosphide may also be used instead of gallium phosphide.

The gold layer and the gold pattern, respectively, may be provided on a titanium layer, for example, for contacting silicon transistors.

What is claimed is:

1. A method of manufacturing a semiconductor body having a patterned gold layer, which comprises the steps of:

providing a semiconductor body;

providing a gold layer on a surface of said semiconductor body;

locally providing an etchant-resistant and electrically insulating patterned masking layer on the surface of said gold layer;

subjecting the masked gold layer to a chemical etching treatment at a selected rate in an etching bath to form the patterned gold layer;

applying a potential to said gold layer with respect to an electrode in the etching bath during the etching treatment; and selecting the magnitude of the applied potential to be such that the etch rate is maintained at a rate no higher than said selected rate of the chemical etching treatment in the absence of an applied voltage.

2. A method as in claim 1, wherein a patterned insulating layer is provided on said body prior to providing the gold layer, and wherein said gold layer is then provided partly on said body and partly on said patterned insulating layer.

3. A semiconductor body having a patterned gold layer manufactured by means of the method as claimed in claim 1.

* * * * *